(12) United States Patent
Runnion et al.

(10) Patent No.: US 6,944,057 B1
(45) Date of Patent: Sep. 13, 2005

(54) METHOD TO OBTAIN TEMPERATURE INDEPENDENT PROGRAM THRESHOLD VOLTAGE DISTRIBUTION USING TEMPERATURE DEPENDENT VOLTAGE REFERENCE

(75) Inventors: Edward F. Runnion, Santa Clara, CA (US); Tien-Chun Yang, San Jose, CA (US); Binh Quang Le, San Jose, CA (US); Shigekazu Yamada, Cupertino, CA (US); Darlene G. Hamilton, San Jose, CA (US); Ming-Huei Shieh, Cupertino, CA (US); Pau-Ling Chen, Saratoga, CA (US); Kazuhiro Kurihara, Tokyo (JP)

(73) Assignee: FASL LLC, Sunnyvale, CA (US)

( * ) Notice: Subject to any disclaimer, the term of this patent is extended or adjusted under 35 U.S.C. 154(b) by 0 days.

(21) Appl. No.: 10/431,065

(22) Filed: May 6, 2003

(51) Int. Cl.[7] .............................................. G11C 16/06
(52) U.S. Cl. ............................ 365/185.2; 365/185.24; 365/211
(58) Field of Search ........................... 365/211, 185.2, 365/185.24

(56) References Cited

U.S. PATENT DOCUMENTS

| | | | | |
|---|---|---|---|---|
| 6,233,190 B1 | * | 5/2001 | Cooper et al. | 365/212 |
| 6,337,813 B2 | * | 1/2002 | Marr | 365/189.09 |
| 6,400,638 B1 | * | 6/2002 | Yamada et al. | 365/230.06 |
| 6,781,907 B2 | * | 8/2004 | Marr | 365/211 |

* cited by examiner

*Primary Examiner*—Van Thu Nguyen
*Assistant Examiner*—Pho M. Luu

(57) ABSTRACT

A method for controlling gate voltage in a memory device is described. The method includes providing a circuit that is adapted to be coupled with the memory device. The circuit is for generating a reference voltage. The method further includes utilizing the reference voltage provided by the circuit to apply a voltage at a gate of the memory device. The voltage has a value corresponding to a temperature of the memory device. The method also includes retaining a proportional relationship between the reference voltage and the temperature of the memory device, regardless of the change in the temperature of the memory device. The reference voltage provides a substantially constant programming time for the memory device regardless of the temperature of the memory device.

16 Claims, 9 Drawing Sheets

800

```
Providing a circuit adapted to be coupled to a
memory device. The circuit is adapted to
generate a reference voltage.
802
```

```
Utilizing the reference voltage provided by
the circuit to apply a voltage to a gate of
the memory device. The voltage has a
value corresponding to a temperature
of the memory device
804
```

```
Providing a substantially constant programming
time for the memory device by applying the
reference voltage to a gate of the memory
device in response to a change in temperature of
the memory device, regardless of the
temperature of the memory device.
806
```

FIG. 8

METHOD TO OBTAIN TEMPERATURE INDEPENDENT PROGRAM THRESHOLD VOLTAGE DISTRIBUTION USING TEMPERATURE DEPENDENT VOLTAGE REFERENCE

TECHNICAL FIELD

The present invention relates to memory devices. More particularly, the present invention relates to programming of memory devices.

BACKGROUND ART

A flash memory device is a type of EEPROM (electrically erasable programmable read only memory) and is fast becoming a common device to store information. Today's flash memory devices are being used in numerous electronic devices including, but not limited to, digital cameras, MP3 players, laptop computers, personal digital assistants (PDAs), video game consoles, and the like. It is noted that numerous printers, e.g., inkjet, laser, and dedicated photograph printers are also being configured with flash memory drives to read flash memory devices. A flash memory device provides both the speed of volatile memory (RAM-random access memory) and the data retentive qualities of non-volatile memory (ROM.-read only memory). Additionally, with continued miniaturization of components and circuitry within an electronic system, flash memory devices are well suited to be incorporated into the diminutively sized systems.

Subsequent to completing fabrication of a flash memory device, the memory device requires programming voltages including, but not limited to, gate voltage. There are many methods in which the memory device can receive the various programming voltages. It is known that the programming current into the floating gate decreases as the temperature increases. Thus, as the temperature of the memory device increases, the time required to program the memory device also increases.

When a memory device is operating at a particular temperature, e.g., 10° C., given a particular gate voltage, there is an associated programming time. When a memory device is operating at a higher temperature, e.g., 70° C., given that same particular gate voltage, there is an increase in the associated programming time. Because conventional gate voltage is a constant, and not dependent upon temperature, associated programming time can be from two to ten times longer.

FIG. 1 is a graph 100 which shows the relationship between an increase in memory device programming time, e.g., programming time 110 (vertical axis with greater time toward the top), as caused by an increase in memory device temperature, e.g., temperature 120 (horizontal axis with higher temperatures to the right). This is depicted by line 150. Line 150 shows that as temperature 120 increases, the time to program a memory device increases in a non-linear manner.

This is due to, in part, reduced kinetic energy of the tunneling electrons, degraded by the severe scattering of electrons at higher temperatures. This means the electrons pick up kinetic energy as a result of the temperature increase and, instead of the electrons in the channel being pulled up into the gate, the electrons scatter into the drain region of the memory device. This unintended source to drain current flow is, to some extent, a short to the channel.

One method to overcome the inherent problem is to increase the amount of current applied to the memory device during programming. While this may be minimally effective at lower temperatures, at higher temperatures, such as those associated with programming of flash memory devices, increasing the current merely increases the amount of electron scattering. In some instances, scattering is such that current flows through a channel and into a drain region, and a programming voltage is not drawn into a gate but is therefore scattered to a drain region of a memory device.

Thus a need exists for a way to control gate voltage in a memory device. An additional need exists for a way to control gate voltage in such a way that gate voltage can be changed dynamically when a memory device is subject to change in temperature. A further need exists for a way to control gate voltage in such a way that time to program a memory device remains constant through a wide range of temperatures.

DISCLOSURE OF THE INVENTION

Accordingly, embodiments of the present invention are drawn to providing a method and apparatus for controlling gate voltage in a memory device. Embodiments of the present invention further provide a method and apparatus that achieve the above listed accomplishment and further provide for dynamic adjustment of a gate voltage in response to a change in temperature in a memory device. Embodiments of the present invention further provide a method and apparatus that achieve the above listed accomplishments and which further provide a constant time to program through a wide range of memory device operating temperatures.

In one embodiment, the present invention is a method for controlling gate voltage in a memory device. In one embodiment, the method is comprised of providing a circuit that is adapted to be coupled with the memory device. The circuit is for generating a reference voltage. The method is further comprised of utilizing the reference voltage provided by the circuit to apply a voltage at a gate of the memory device. The voltage has a value corresponding to a temperature of the memory device. The reference voltage provides a substantially constant programming time for the memory device regardless of the temperature of the memory device.

These and other advantages of the present invention will no doubt become obvious to those of ordinary skill in the art after having read the following detailed description of the preferred embodiments which are illustrated in the various drawing figures.

BRIEF DESCRIPTION OF THE DRAWINGS

The accompanying drawings, which are incorporated in and form a part of this specification, illustrate embodiments of the invention and, together with the description, serve to explain the principles of the invention.

FIG. 8 is flowchart of a process for obtaining a temperature independent programming voltage by utilizing a temperature dependent reference voltage.

BEST MODES FOR CARRYING OUT THE INVENTION

A method and apparatus to obtain temperature independent program threshold voltage distribution using temperature dependent voltage reference is described. Reference will now be made in detail to the preferred embodiments of the invention, examples of which are illustrated in the accompanying drawings.

While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention.

The present invention, in one embodiment, comprises a circuit coupled to a memory device. The circuit provides a temperature dependent reference voltage ($V_{ref}$). The $V_{ref}$ enables the programming voltage at the gate ($V_g$) that is received from a pump circuit to be adjusted as a function of temperature. Thus, when memory device temperature changes, the temperature dependent reference voltage ($V_{ref}$), as provided by the circuit, adjusts gate voltage of the memory device. Therefore, when temperature increases, $V_g$ is increased, and when temperature decreases, $V_g$ is reduced. Accordingly, by dynamically adjusting programming voltage at the gate ($V_g$), electrons injected into the channel, by, e.g., hot carrier injection, are more readily drawn to the charge storage region regardless of temperature.

Advantageously, embodiments of the present invention, as will be shown, below, provide dynamic adjustment of gate voltage ($V_g$) in a memory device in response to a change in memory device temperature, such that consistent programming characteristics of the flash memory device are realized.

Embodiments of the present invention are discussed primarily in the context of memory devices, such as flash memory devices. However, it is recognized that embodiments of the present invention can be utilized by other memory devices that are programmable and in which the characteristics and programming time of the memory device are affected by changes in temperature, including, but not limited to flash memory devices.

Figure 2:
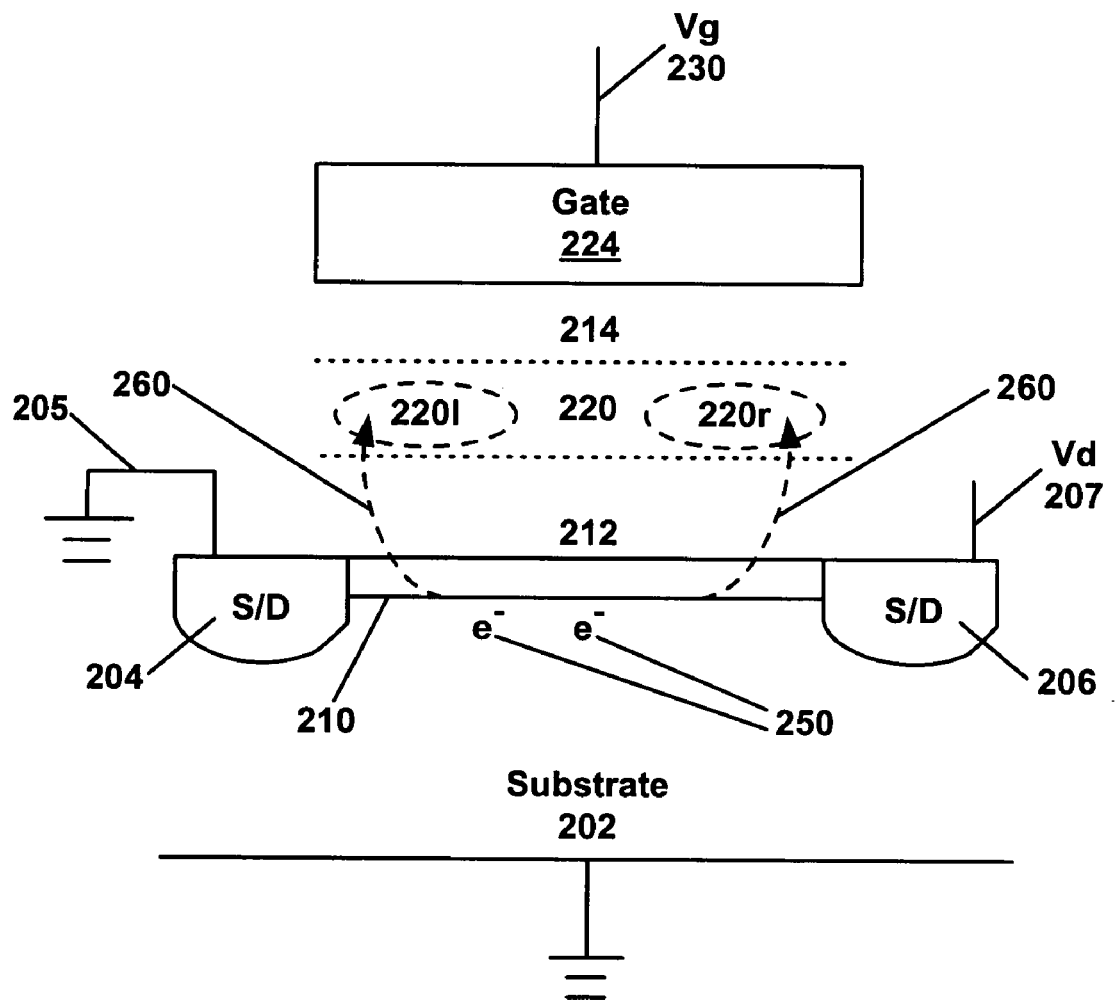
FIG. 2 is an illustration of a memory device upon which embodiments of the present invention may be practiced, in accordance with one embodiment of the present invention.

FIG. 2 is an illustration of a memory device, e.g., memory device 200, in one embodiment of the present invention. In one embodiment, memory device 200 is a flash memory device. In another embodiment of the present invention, memory device 200 is a MirrorBit™ flash memory device. However, it is noted that the present invention can be utilized to provide dynamic adjustment of programming voltage, e.g., at the gate ($V_g$), in nearly any memory device. Further, embodiments of the present are well suited to be implemented in the fabrication of nearly any memory device.

Still referring to FIG. 2, memory device 200 has had various processes and procedures performed thereon in the fabrication thereof. These processes and procedures include, but are not limited to, growing and forming of a silicon substrate, e.g., substrate 202, masking processes, etching processes, photoresist processes, CMP processes, and channel formation, e.g., channel 210. Further included are processes for forming selectable electrode regions, e.g., source/drain region (S/D) 204 and source/drain region (S/D) 206, forming a first and second oxide layer, e.g., layer 212 and layer 214, respectively, and forming a charge storage region, e.g., layer 220, and a poly layer, e.g., gate 230, respectively. In one embodiment, layers 212 and 214 can be tunnel oxide layers, charge storage region 220 can be a floating gate, and layer 230 can be a control gate. In another embodiment, layers 212 and 214 can be thermal oxide layers. In the present embodiment, layer 212 is an oxide layer, layer 220 is a nitride layer, layer 214 is an oxide layer, and layer 224 is a poly layer.

In a conventional flash memory device, a source region and a drain region are distinctly doped, thus providing a current flow from source to drain. It is noted that in a MirrorBit™ flash memory device, as shown in FIG. 2, source and drain regions are similarly formed, thus providing a selectable bi-directional current flow, from either S/D 204 to S/D 206, or from S/D 206 to S/D 204. Accordingly, depending upon the direction of the current flow within channel 210, electrons can be drawn from channel area 210 into either charge storage region 220l (left side) or charge storage region 220r (right side) of layer 220, as indicated by dotted lines 260. For example, when S/D 204 is selected as source, then electrons 250 are drawn to charge storage region 220r, and correspondingly, when S/D 206 is selected a source, then electrons 250 are drawn to charge storage region 220l. Regions 220l and 220r, as shown in FIGS. 2 and 4B, are depicted as elliptically shaped entities for exemplary purposes and, as such, should not be construed as a limitation, but rather to illustrate that that regions 220l and 220r are disposed on each side of charge storage region 220. It is further noted that charge storage regions 220l and 220r are independent of each other although disposed within the same charge storage region, layer 220.

By virtue of layer 220 being substantially comprised of nitride, a non-conductive compound, when electrons are stored in charge storage region 220l or 220r, those electrons remain trapped in that side of charge storage region 220. By providing individual and independent storage of each of the two units of charge, instead of two states (0,1) of charge storage, as in a conventional flash memory device, four states (0,0; 0,1; 1,0; and 1, 1) of charge storage are provided in a MirrorBit™ flash memory device. Therefore, each unit of charge can be programmed or erased, and a full charge can be stored at each side of charge storage region 220.

Referring still to memory device 200 of FIG. 2, subsequent to the fabrication processes as described above, selectable source/drain region 204 is coupled to a ground, e.g., ground 205, and a voltage is applied to selectable source/drain region 206, e.g., $V_d$ 207, thus providing a current flow from source region 204 to drain region 206, or vice-versa. Electrons, e.g., electrons 250, in substrate 202 are to be drawn into nitride layer 220 for programming. As described previously, when the temperature of memory device 200 rises, the electrons scatter to either source/drain region 204 or 206, instead of being drawn up to nitride layer 220, indicated by dashed line 260.

Figure 3:
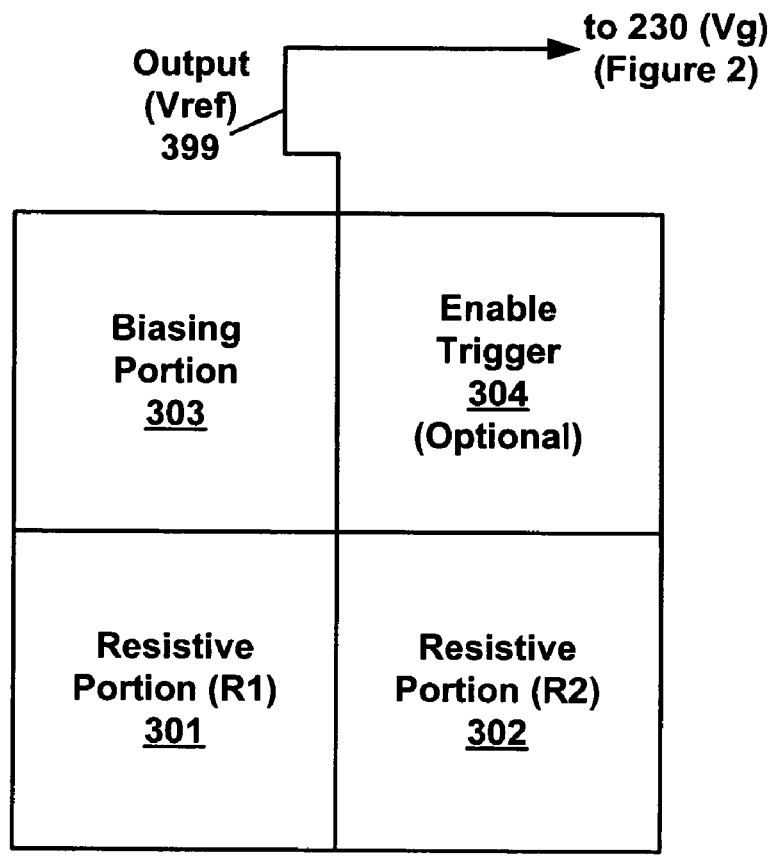
FIG. 3 is a block diagram of a circuit for providing a temperature dependent reference voltage, in accordance with one embodiment of the present invention.

Advantageously, embodiments of the present invention provide a circuit, e.g., circuit 300 of FIG. 3 and circuit 400 of FIG. 4, that is adapted to be located proximal to and coupled with memory device 200 at $V_g$ 230. Thus: in various embodiments of the present invention, the output of circuit 300, $V_{ref}$ 399, becomes $V_g$ 230. Because $V_{ref}$ 399, as provided by circuit 300, is dependent upon temperature, $V_{ref}$ 399 dynamically adjusts $V_g$ 230 in response to a change in temperature. As temperature increases, $V_{ref}$ 399/$V_g$ 230 increases, and as temperature decreases, $V_{ref}$ 399/$V_g$ 230 is reduced. Thus: in various embodiments of the present invention, increasing or decreasing $V_{ref}$ 399/$V_g$ 230 in accordance with temperature provides a proportionately stable gate voltage potential to memory device 200, relative to temperature, such that electrons 250 are more steadily drawn into nitride layer 220, as indicated by line 260 in FIG. 2. Thus consistent programming time is realized.

FIG. 3 is a block diagram of a circuit, circuit 300, which is coupled with memory device 200 at $V_g$ 230 (FIG. 2) and which provides a temperature dependent reference voltage ($V_{ref}$) for dynamically adjusting programming voltage at the gate ($V_g$ 230), in accordance with one embodiment of the present invention. In this example, circuit 300 is comprised of four subportions; e.g., biasing portion 303, a first resistive portion (R1) 301, a second resistive portion (R2) 302, and an optional enable trigger portion 304. Biasing portion 303 provides, in one embodiment, a DC bias that is lower than a VCC (e.g., VCC 406 of FIG. 4) coupled thereto. In one embodiment, biasing portion 303 provides a DC bias with a voltage ranging from one to two volts.

Still referring to FIG. 3, in one embodiment, the ratio between resistive portion (R2) 302 and resistive portion (R1) 301 (R2:R1) provides the temperature dependent reference voltage ($V_{ref}$ 399) that is outputted to $V_g$ 230 of memory device 200 of FIG. 2. Accordingly, $V_{ref}$ 399 (or $V_{ref}$ 499 of FIG. 4) is dependent upon the ratio of R2 to R1. Enable trigger portion 304 provides an on/off switch for circuit 300 (and circuit 400). In one embodiment, enable trigger portion 304 is a permanent function of circuit 300. In another embodiment, enable trigger portion 304 is optional, such that it can be enabled or not utilized.

Figure 4A:
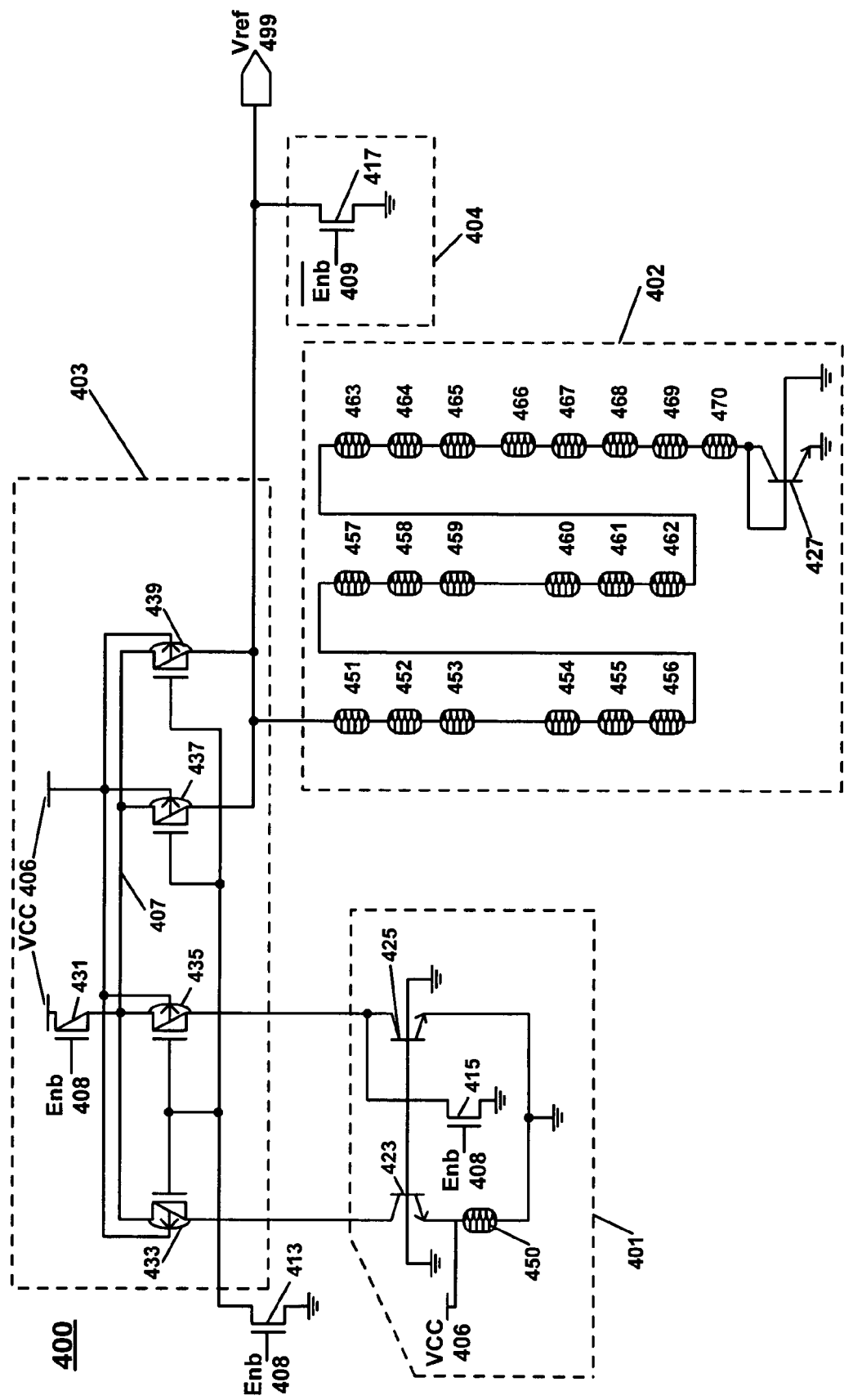
FIG. 4A is a detailed illustration of a circuit which can be implemented to provide a temperature dependent reference voltage, in accordance with one embodiment of the present invention.
Figure 4B:
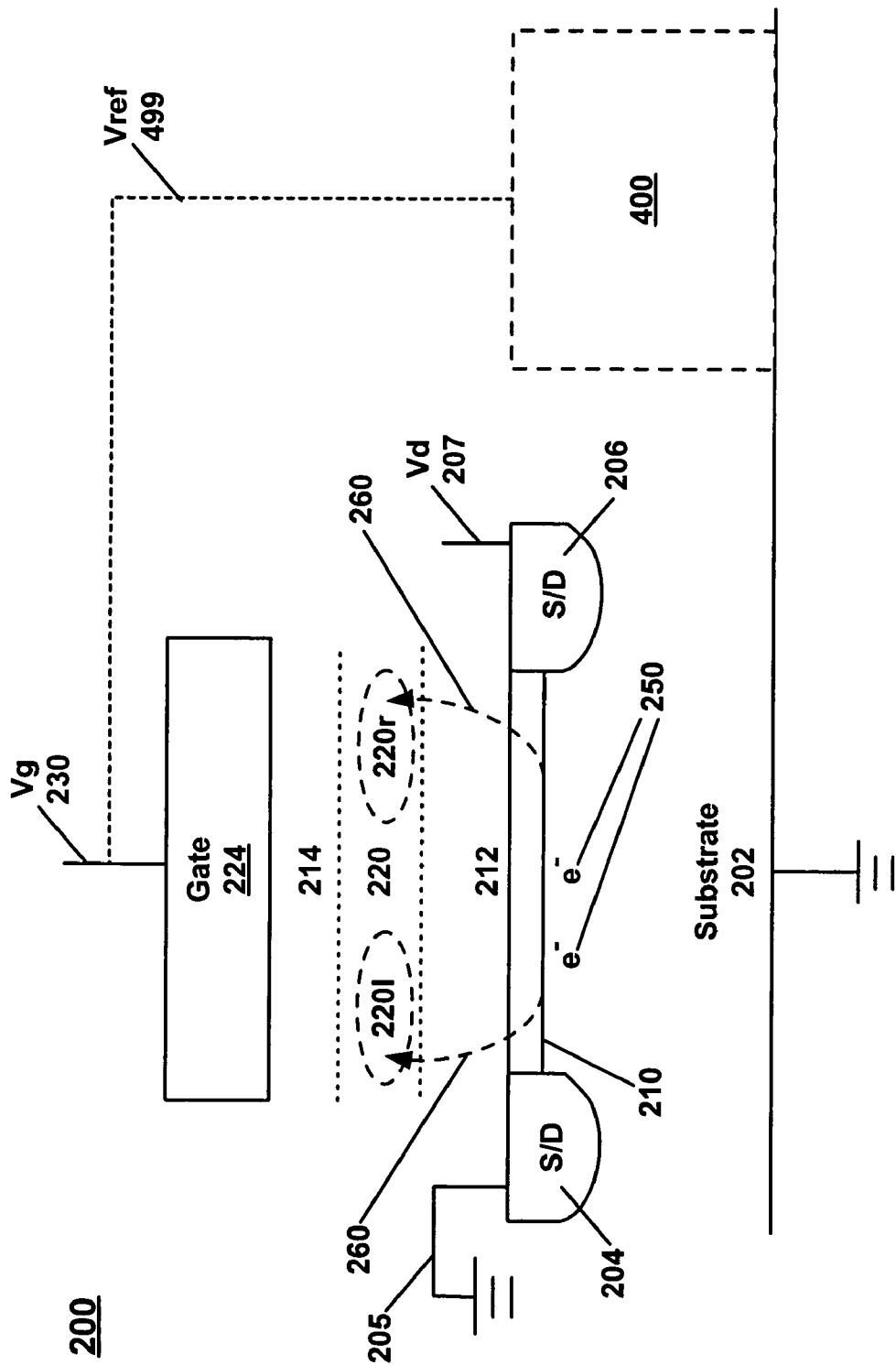
FIG. 4B is an illustration of the circuit of FIG. 4A implemented proximal to the memory device of FIG. 2, in accordance with one embodiment of the present invention.

FIG. 4A is a detailed illustration of a circuit, circuit 400, that can be implemented as a circuit 300 for providing a temperature dependent reference voltage, e.g., $V_{ref}$ 399 of FIG. 3 and $V_{ref}$ 499 of FIG. 4A, in one embodiment of the present invention. Dotted line 403 is indicative of a biasing portion of circuit 400, which is functionally analogous to biasing portion 303 of FIG. 3. Dotted line 401 in indicative of a first resistive portion (R1) of circuit 400, which is functionally analogous to first resistive portion (R1) 301 of FIG. 3. Dotted line 402 is indicative of a second resistive portion (R2) of circuit 400, which is functionally analogous to second resistive portion (R2) 302 of FIG. 3. Dotted line 404 is indicative of an enable trigger portion of circuit 400, and is functionally analogous to enable trigger portion 304 of FIG. 4A. In one embodiment, enable trigger portion 404 can be optional, such that circuit 400 is always in a functioning mode.

Referring to biasing portion of circuit 400 of FIG. 4, indicated by dotted line 403, shown are transistors 431, 433, 435, 437, and 439, in one embodiment of the present invention. VCC 406 is coupled with a bulk electrode of transistors 433, 435, 437, and 439, respectively. VCC is also coupled with a drain electrode of transistor 431. A gate electrode of transistor 431 is coupled to an enable signal 408. A source electrode of transistor 431 is coupled to VCCD 407. VCCD 407 is also coupled with a drain electrode of transistors 433, 435, 437, and 439, respectively. A gate electrode of transistor 433 is coupled to a gate electrode of transistor 435 and also to a drain electrode of transistor 413. A source electrode of transistor 433 is coupled with a drain electrode of transistor 413. Gate electrodes of transistor 437 and transistor 439 are coupled to a drain electrode of transistor 413. Source electrodes of transistor 437 and transistor 439 are coupled with $V_{ref}$ 499. In one embodiment, transistors 431, 433, 435, 437, and 439 are PMOS transistors. It is noted that the circuit configuration within dotted line 403 is to more clearly depict an example of a biasing portion of circuit 400. It is further noted that many differing configurations can be implemented, and as such, portion 403 should not be considered limiting, but exemplary as to the functionality contained therein.

Referring to a first resistive portion of circuit 400 of FIG. 4A, indicated by dotted line 401, shown are transistors 415, 423, and 425, and resistor 450, in one embodiment of the present invention. Transistor 423 has a collector electrode coupled with a drain electrode of transistor 433. Transistor 423 has an emitter electrode coupled with a VCC 406, and which is also coupled with one electrode of resistor 450. Resistor 450 has another electrode coupled with a ground and also an emitter electrode of transistor 425. A base electrode of transistor 423 is coupled with a base electrode of transistor 425. An emitter electrode of transistor 425 is coupled with a source electrode of transistor 435 as well as being coupled in feedback to the base electrodes of transistors 423 and 425, respectively. Transistor 415 shows having a collector electrode coupled with the bases of transistors 423 and 425, a base electrode coupled with an enable signal 408, and a emitter electrode coupled to a ground. In one embodiment, transistors 423 and 425 are NPN type transistors and transistor 415 is an NMOS transistor. It is noted that the circuit configuration within dotted line 401 is to more clearly depict an example of a first resistive portion of circuit 400. It is further noted that many differing configurations can be implemented, and as such, portion 401 should not be considered limiting, but exemplary as to the functionality contained therein.

Still with reference to FIG. 4A, a second resistive portion of circuit 400, indicated by dotted line 402, shown are series resistors 451–470 and transistor 427, in one embodiment of the present invention. Transistor 451 has one electrode coupled with source electrodes of transistors 437 and 438 (portion 403), respectively, and another electrode coupled with the remaining series resistors 452–470. Resistor 470 has one electrode coupled with series resistors 450–469 and another electrode coupled with a collector electrode of transistor 427. Transistor 427 has its collector electrode also coupled to its base electrode in feedback. An emitter electrode of transistor 427 is coupled to ground. In one embodiment, transistor 427 is an NPN type transistor. Table One, below, shows the approximate resistive values of resistor 450 and series resistors 451–470, in one embodiment of the present invention.

TABLE 1

| Resistor Number | Approximate Resistor Value |
| --- | --- |
| 450 | 2.80 |
| 451 | 3.90 |
| 452 | 0.50 |
| 453 | 0.32 |
| 454 | 3.90 |
| 455 | 0.50 |
| 456 | 0.32 |
| 457 | 3.90 |
| 458 | 0.50 |
| 459 | 0.32 |
| 460 | 3.90 |
| 461 | 0.50 |
| 462 | 0.32 |
| 463 | 3.90 |
| 464 | 0.50 |
| 465 | 0.32 |
| 466 | 1.00 |
| 467 | 2.00 |
| 468 | 3.00 |
| 469 | 4.00 |
| 470 | 4.90 |

Still with reference to FIG. 4A, in enable trigger portion of circuit 400, indicated by dotted line 404, shown is transistor 417, in one embodiment of the present invention. Transistor 417 has a gate electrode coupled with an enable (not) signal 409, a source electrode coupled to a ground and a drain electrode coupled to the drains of transistors 437 and 439 (portion 401). In one embodiment, transistor 417 is an NPN type transistor. When received enable signal 408 at transistors 413, 415, and 431, is a zero there is a one at transistor 417, and as such, $V_{ref}$ 499 is drawn to ground. When received enable signal 408 is a zero, there is a one at transistor 417, and as such, $V_{ref}$ 499 is outputted to, in this instance, $V_g$ 230 of FIG. 2, also shown in FIG. 4B.

FIG. 4B shows circuit 400 implemented proximal to memory device 200, in one embodiment of the present invention. Circuit 400 of FIG. 4B is analogous to circuit 300 of FIG. 3 and circuit 400 of FIG. 4A and memory device 200 is analogous to memory device 200 of FIG. 2. Circuit 400 outputs a temperature dependent reference voltage, $V_{ref}$ 499, which then becomes $V_g$ 230. By disposing circuit 400 proximal to memory device 200 and within substrate 202, when there is a change in temperature of memory device 200, there is a comparable change in temperature of circuit 400. $V_g$ 230 is initially set to a particular potential, given a particular memory device and given a particular temperature, wherein the initial potential is proportional to a desired effect, such that at the particular temperature, the memory device will require a determined amount of time to be programmed, given the initial potential. Circuit 400 provides dynamic adjustment of $V_g$ 230 ($V_{ref}$ 499) during changes in temperature, such that the proportion of potential to temperature remains equivalent, and thus consistent time to program is realized.

Figure 5A:
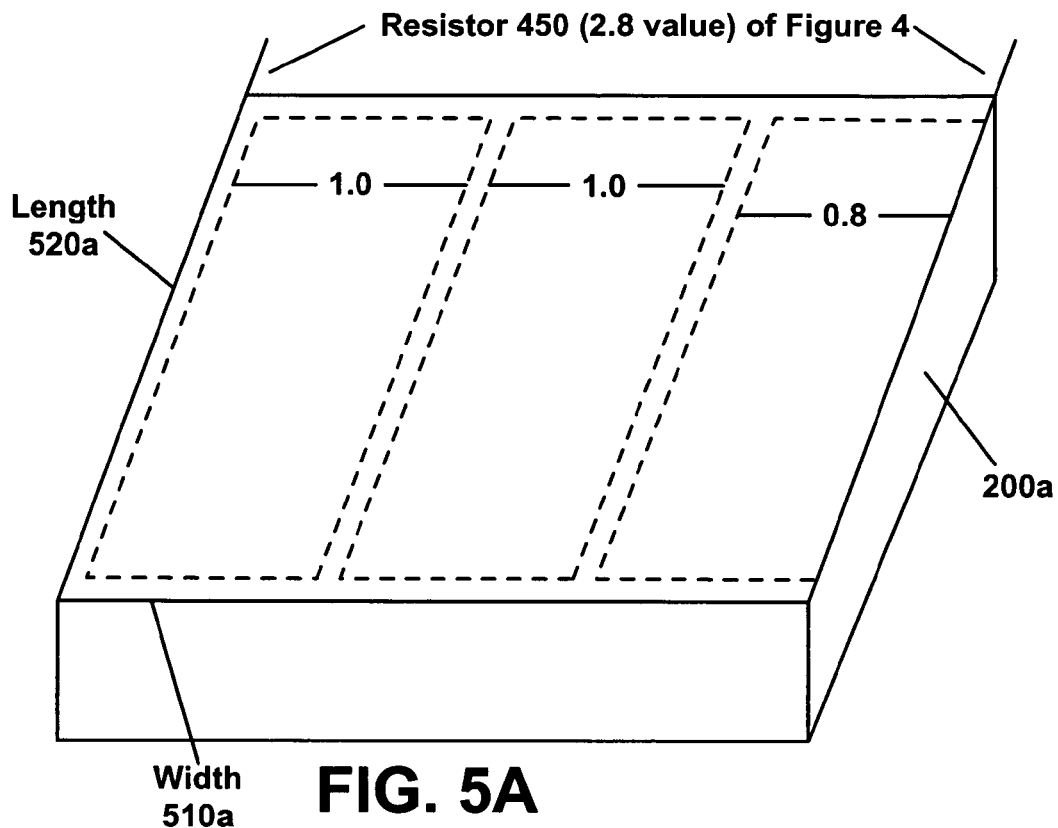
FIG. 5A is an illustration of an example of how resistance values are determined in the circuit of FIG. 4A, in accordance with one embodiment of the present invention.

FIG. 5A is an illustrated example of how a resistance value, e.g., resistor 450 of FIG. 4, is determined, in accordance with one embodiment of the present invention. In the present embodiment, resistance values are determined, not by ohms as is customary, but rather as a measure of real estate with the memory device. FIG. 5A shows a memory device 200a analogous to memory device 200 of FIG. 2.

Memory device 200a has a width 510a and a length 520a. Dividing length by width gives the number of squares possible, and the resistance is then determined. In this example, resistor 450 has a value of 2.8, meaning that 2.8 resistor squares can be extrapolated in memory device 200.

Figure 5B:
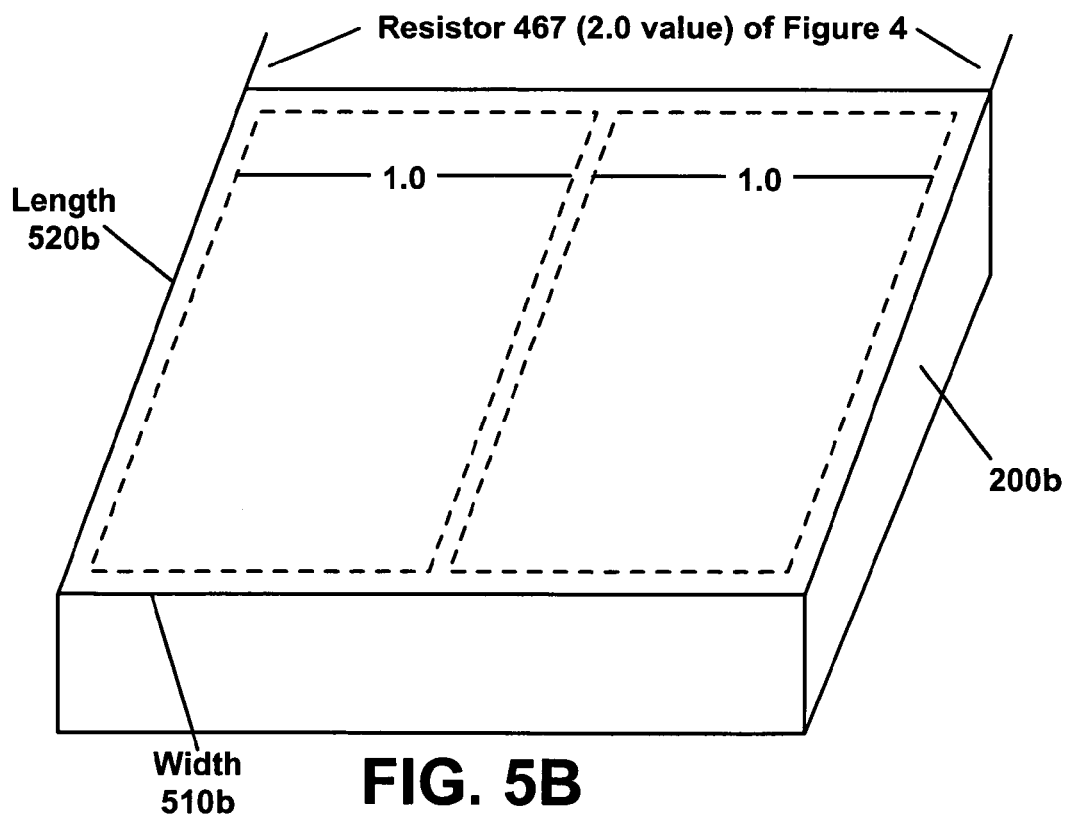
FIG. 5B is an illustration of another example of how resistance values are determined in the circuit of FIG. 4A, in accordance with one embodiment of the present invention.

FIG. 5B is another example of resistance value determination, in accordance with the present embodiment. In this example, resistor 467 of FIG. 4 is shown. Using the same manner to determine resistance value, as described above, resistor 467 has a value of 2.0, meaning that 2.0 resistor squares can be extrapolated in memory device 200.

Figure 1:
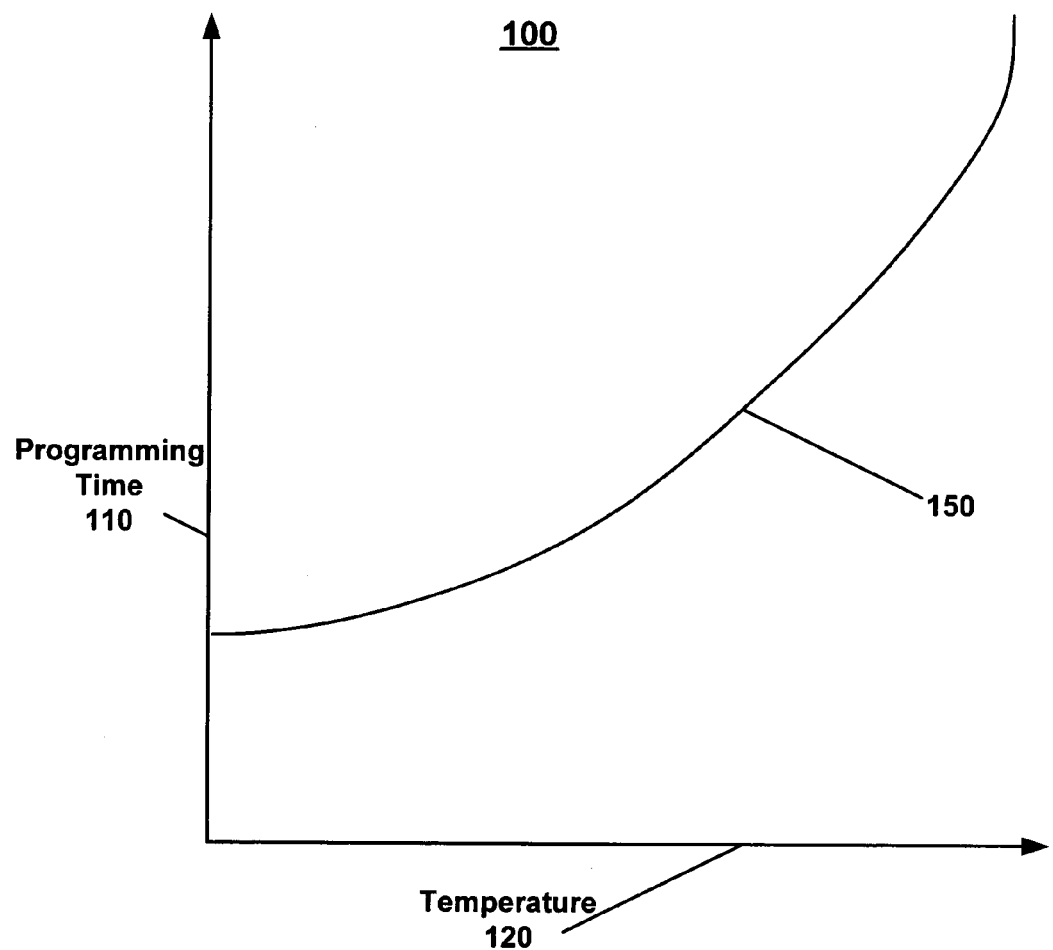
FIG. 1 is a graph showing an exemplary relationship of memory device programming time and memory device temperature, in which an increase in temperature causes an increase in programming time.
Figure 6:
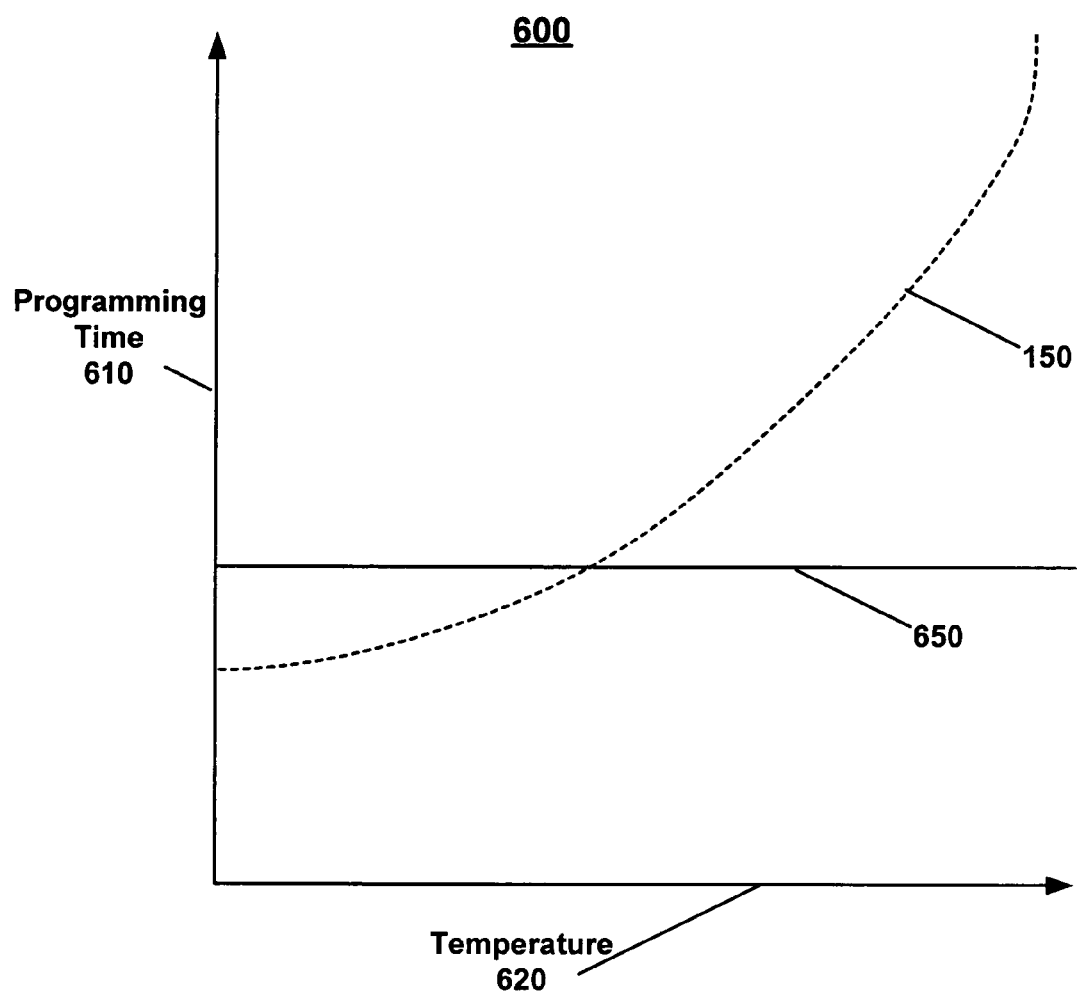
FIG. 6 is a graph which shows the relationship of memory device programming time and memory device temperature, in accordance with one embodiment of the present invention.

FIG. 6 is a graph 600 showing the relationship between programming time 610 (vertical axis) and temperature 620 (horizontal axis), in one embodiment of the present invention. In accordance with one embodiment of the present invention, solid line 650 represents that which is provided by circuit 300 or 400 (FIGS. 3A and 4A), a constant time to program a memory device, e.g., memory device 300 of FIG. 3, regardless of temperature. Dotted line 150 represents an exemplary increase in time to program, or where an increase in temperature causes an increase in time to program, as described in FIG. 1.

Figure 7:
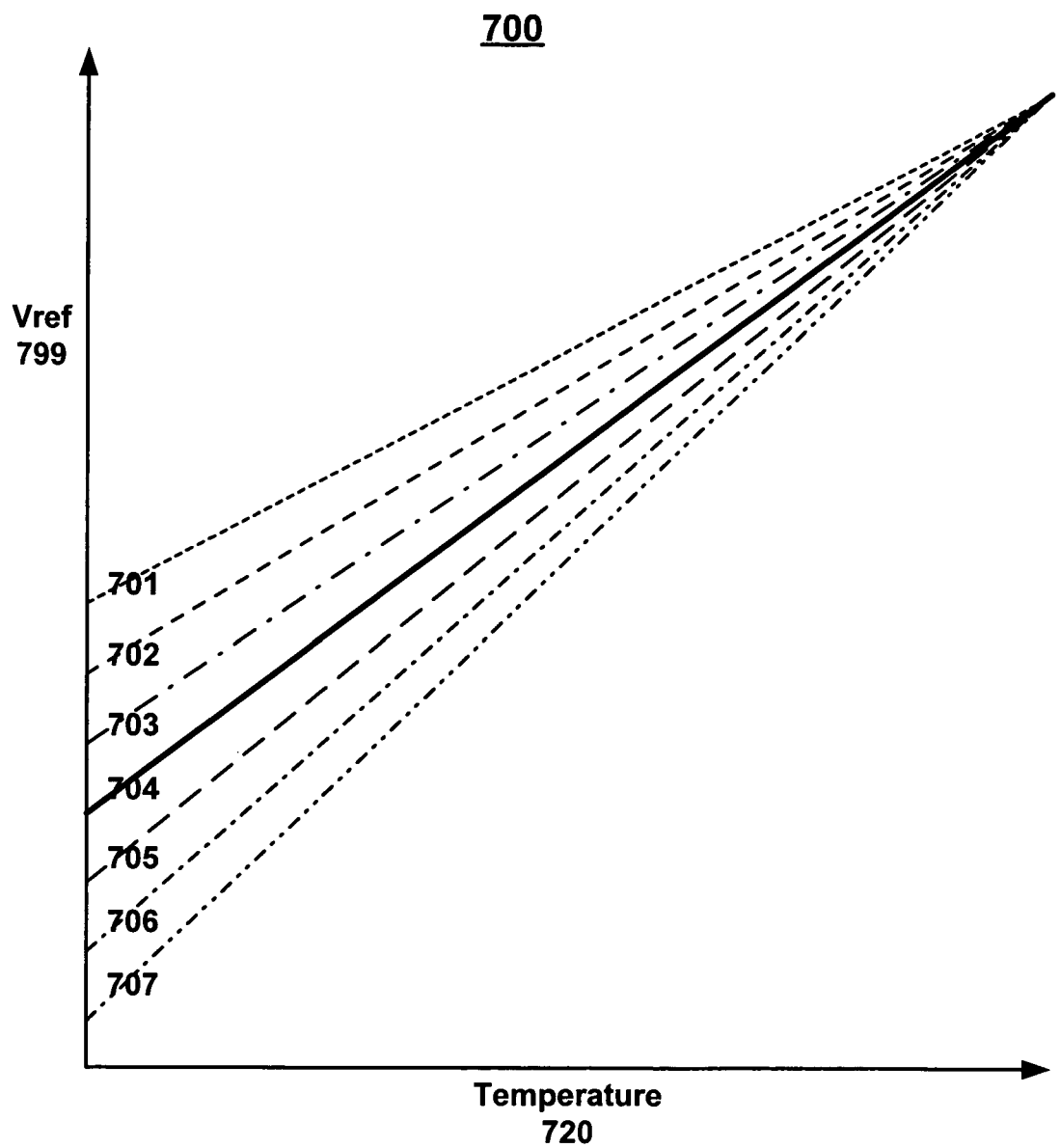
FIG. 7 is a graph which shows the relationship of a reference voltage outputted by the circuit of FIG. 3 and memory device temperature, in accordance with one embodiment of the present invention.

FIG. 7 is another graph representing circuit 400 providing dynamic adjustment to programming voltage at a gate, $V_g$ 230, for a variety of memory devices 200, shown as lines 701–707. $V_{ref}$ 499, outputted by a circuit, e.g., circuit 400, is adjusted in response to a change in temperature, regardless of the memory device or regardless of temperature, such that the potential at $V_g$ remains proportional to a particular temperature, thus providing a constant time to program.

FIG. 8 is a flowchart 800 of steps performed in accordance with one embodiment of the present invention for providing dynamic adjustment of gate voltage in response to a change in temperature. Flowchart 800 includes processes of the present invention which are carried out by electrical components. Although specific steps are disclosed in flowchart 800, such steps are exemplary. That is, the present invention is well suited to performing various other steps or variations of the steps recited in FIG. 8. Within the present embodiment, it should be appreciated that the steps of flowchart 800 may be performed by software, by hardware or by any combination of software and hardware.

In step 802 of FIG. 8, a circuit, e.g., circuit 400 of FIG. 4A, is provided and that is adapted to be coupled to a memory device, e.g., memory device 200 of FIG. 2, in one embodiment of the present invention. Circuit 400 is for providing a temperature dependent reference voltage to a memory device, e.g., memory device 200. An illustration of the coupling of a circuit, e.g., circuit 400, to memory device 200 is shown in FIG. 4B. The output of circuit 400, $V_{ref}$ 499 is coupled to a gate voltage, e.g., $V_g$ 230 of memory device 200.

In step 804 of FIG. 8, the reference voltage provided by circuit 400, $V_{ref}$ 499, is applied to a gate, e.g., $V_g$ 230 of memory device 200. The voltage applied has a value corresponding to a temperature of memory device 20. The gate voltage, $V_g$ 230 is dynamically adjusted by the reference voltage provided by circuit 400, $V_{ref}$ 499 in response to a change in the temperature of memory device 200. If the temperature of memory device decreases, then the output of circuit 400, $V_{ref}$ 499, is proportionally decreased, and if the temperature of memory device increases, then the output of circuit 400, $V_{ref}$ 499, is proportionally increased.

In step 806 of FIG. 8, by adjusting the gate voltage, $V_g$ 230 of memory device 200 with the reference voltage provided by circuit 400, in response to a change in temperature of memory device 200, a substantially constant programming time is provided for memory device 200 regardless of the change in temperature. Advantageously, embodiments of the present invention can provide a temperature dependent reference voltage for a wide variety of memory device operating in wide range of temperature variations.

The foregoing description of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilized the invention and various embodiments with various modifications as are suited to the particular use contemplated. It is intended that the scope of the invention be defined by the claims appended hereto and their equivalents.

What is claimed is:

1. A method for controlling gate voltage in a memory device comprising:
   providing a circuit adapted to be coupled with said memory device, said circuit for generating a reference voltage;
   utilizing said reference voltage provided by said circuit to apply a voltage at a gate of said memory device, said voltage having a value corresponding to a temperature of said memory device;
   retaining a proportional relationship between said reference voltage and said temperature of said memory device, regardless of said change in said temperature of said memory device; and
   wherein said reference voltage provides a substantially constant programming time for said memory device regardless of said temperature of said memory device.

2. The method as recited in claim 1 further comprising reducing said voltage at said gate in response to a reduction in said temperature of said memory device.

3. The method as recited in claim 2 wherein said voltage is reduced dynamically during said reduction of said temperature of said memory device.

4. The method as recited in claim 1 further comprising increasing said voltage at said gate in response to an increase in said temperature of said memory device.

5. The method as recited in claim 4 wherein said voltage is increased during said increase of said temperature of said memory device.

6. The method as recited in claim 1 wherein said memory device is a flash memory device.

7. The method as recited in claim 1 wherein said gate is a control gate in said memory device.

8. A circuit for generating a temperature dependent reference voltage to a gate of a memory device comprising;
   a biasing portion for providing a bias voltage to said circuit;
   a first resistive portion coupled with said biasing portion;
   a second resistive portion, coupled with said biasing portion and said first resistive portion, wherein said temperature dependent reference voltage is dependent upon the ratio between said second resistive portion and said first resistive portion; and
   wherein said temperature dependent reference voltage is increased when an increase in temperature of said memory device is realized, and wherein said temperature dependent reference voltage is reduced when a decrease in temperature of said memory device is realized.

9. The circuit of claim 8 further comprising:
   an enable trigger portion coupled with biasing portion and said first resistive portion and said second resistive portion for enabling said circuit to couple said temperature dependent reference voltage to said gate of said memory device.

10. The circuit of claim 8 further comprising:
    an output coupled to said gate of said memory device for inputting of said temperature dependent reference voltage.

11. The circuit of claim 8 wherein said circuit is located proximal to said memory device and disposed within a substrate of said memory device.

12. The circuit of claim 11 wherein said disposition of said circuit in said substrate of said memory device enables a change in temperature in said memory device to be comparably realized in said circuit.

13. A circuit for controlling a gate voltage in a memory device comprising:
    means for generating a temperature dependent reference voltage, said means adapted to be coupled to a gate of said memory device;
    means for adjusting said temperature dependent reference voltage in response to a change in temperature of said memory device; and
    means for comparable realization by said circuit of a change in temperature of said memory device.

14. The circuit as recited in claim 13 further comprising:
    means for outputting said temperature dependent reference voltage to said gate of said memory device.

15. The circuit as recited in claim 13 further comprising:
    means for generating a bias voltage for said circuit.

16. The circuit as recited in claim 13 further comprising:
    first resistive means and second resistive means, wherein said temperature dependent reference voltage is dependent upon a ratio between said second resistive means and said first resistive means.

* * * * *